US008358993B2

(12) United States Patent
Quinlan et al.

(10) Patent No.: US 8,358,993 B2
(45) Date of Patent: Jan. 22, 2013

(54) IMAGE REJECTION CALIBRATION SYSTEM

(75) Inventors: Philip Quinlan, Glounthaune (IE); Miguel Chanca, Valencia (ES); Hyman Shanan, Douglas (IE); Vincent Foley, Blarney (IE)

(73) Assignee: Analog Devices, Inc., Norwood, MA (US)

( * ) Notice: Subject to any disclaimer, the term of this patent is extended or adjusted under 35 U.S.C. 154(b) by 817 days.

(21) Appl. No.: 11/881,019

(22) Filed: Jul. 25, 2007

(65) Prior Publication Data
US 2008/0132191 A1 Jun. 5, 2008

Related U.S. Application Data

(60) Provisional application No. 60/833,211, filed on Jul. 25, 2006, provisional application No. 60/844,255, filed on Sep. 13, 2006.

(51) Int. Cl.
H04B 1/18 (2006.01)
H04B 1/10 (2006.01)
(52) U.S. Cl. .............. 455/285; 455/237.1; 455/307
(58) Field of Classification Search ........... 455/237.1, 455/302, 307, 304, 306, 285
See application file for complete search history.

(56) References Cited

U.S. PATENT DOCUMENTS

| 4,710,737 A * | 12/1987 | Matsuta ............... 334/56 |
| 7,149,488 B2 * | 12/2006 | Khorram ............... 455/266 |
| 7,373,124 B2 * | 5/2008 | Okanobu ............... 455/226.1 |
| 2004/0002318 A1 | 1/2004 | Kerth et al. |
| 2004/0005869 A1 * | 1/2004 | See et al. ............... 455/102 |
| 2005/0069056 A1 * | 3/2005 | Willingham ............... 375/327 |
| 2005/0070236 A1 | 3/2005 | Paulus |
| 2005/0070239 A1 | 3/2005 | Paulus |
| 2005/0180528 A1 * | 8/2005 | Manku ............... 375/316 |
| 2005/0186932 A1 * | 8/2005 | Kurimoto et al. ............... 455/284 |
| 2006/0068739 A1 * | 3/2006 | Maeda et al. ............... 455/295 |
| 2007/0072571 A1 * | 3/2007 | Sun et al. ............... 455/280 |
| 2007/0099570 A1 * | 5/2007 | Gao et al. ............... 455/63.1 |
| 2007/0222492 A1 * | 9/2007 | Cafaro et al. ............... 327/261 |
| 2008/0130800 A1 * | 6/2008 | Maxim et al. ............... 375/345 |

OTHER PUBLICATIONS

Elmala, et al., Calibration of Phase and Gain Mismatches in Weaver Image-Reject Receiver, IEEE Journal of Solid-State Circuits, IEEE, vol. 39, No. 2, Feb. 2004, pp. 283-289.
Hajirostam et al., An Analog-Digital Adaptive Image-Reject Technique for Quadrature Receivers, ECCTD, Aug./Sep. 2005.
Der et al., A 2-GHz CMOS Image-Reject Receiver With LMS Calibration, IEEE Journal of Solid-State Circuits, IEEE, vol. 38, No. 2, Feb. 2003, pp. 167-175.
Elahi et al., I/Q Mismatch Compensation Using Adaptive Decorrelation in a Low-IF Receiver in 90-nm CMOS Process, IEEE Journal of Solid-State Circuits, IEEE, vol. 41, No. 2, Feb. 2006, pp. 395-403.

* cited by examiner

Primary Examiner — Christian Hannon
(74) Attorney, Agent, or Firm — Kenyon & Kenyon LLP

(57) ABSTRACT

Image rejection calibration includes initializing the calibration mode by applying to quadrature mixers, in place of the wanted RF input, an RF source in the frequency range of the wanted RF input, sensing the power output from the polyphase filter, developing gain adjust and phase adjust correction values in response to the power output and adjusting in accordance with the correction values the gain of the quadrature signals from the quadrature mixers to the poly-phase filter and the phase of local oscillator quadrature signals from the local oscillator to the quadrature mixers to reduce the power output.

29 Claims, 9 Drawing Sheets

IMAGE REJECTION CALIBRATION SYSTEM

RELATED APPLICATIONS

This application claims benefit of and priority to U.S. Provisional Application Ser. No. 60/833,211 filed Jul. 25, 2006 and U.S. Provisional Application Ser. No. 60/844,255 filed Sep. 13, 2006 both incorporated herein by this reference.

FIELD OF THE INVENTION

This invention relates to an image rejection calibration system and method for a wireless receiver.

BACKGROUND OF THE INVENTION

Achieving good Image Rejection (IR) performance in heterodyne receivers is one of the most important challenges in high performance radio design and the choice of radio architecture used in many applications is very often dictated by the image rejection requirements of the overall system.

For example, in a double superheterodyne architecture, careful consideration must be given to proper frequency planning to achieve good IR performance. In this architecture, the use of a high first IF frequency relaxes the constraints on the RF band select filter at the low noise amplifier (LNA) input and improves image rejection performance. However, this comes at a cost of more expensive and power hungry filters for the first IF stage. On the other hand, a low first IF frequency relaxes the bandwidth, power and cost constraints on the first IF filter but now the external band select filter at the LNA input must have a much higher Q factor to maintain good image rejection performance. Similar consideration must also be given to the selection of the second IF frequency in a double superheterodyne design which also has an image component. In general, superheterodyne receivers can be designed to have excellent selectivity and can exhibit very good image rejection performance, but this comes at a cost of power and complexity and they are not widely used in integrated low power radio designs.

A zero-IF receiver has the primary advantage that it does not have an image component. However, the zero-IF architecture is prone to low frequency impairments such as 1/f noise and DC offset problems and is not suitable for narrowband wireless communication applications such as the Flex/ReFlex pager standards and PMR radio standards such as APCO25 and TETRA, where occupied spectral bandwidths of 6.25 kHz, 12 kHz and 25 kHz are required.

Narrowband wireless telemetry and wireless sensor applications are other examples of communication networks where zero-IF receivers are not widely used. For example, the regulatory bodies; FCC (USA), ETSI (Europe) and ARIB (Japan) permit narrowband wireless telemetry in selected RF bands. In the USA, compliance to FCC part 90 requires channel bandwidths of 6.25-25 kHz channels. In Europe and in Japan, specifications for ETSI EN300-220 and ARIB STD-T67 respectively, require channel bandwidths of 12.5-25 kHz.

A low-IF receiver architecture overcomes the low frequency and 1/f noise problems of the Zero-IF receiver by moving the received spectrum away from DC and this receiver architecture is well suited to the narrowband wireless telemetry applications described above. In a low-IF receiver architecture, image rejection is typically accomplished by the use of Hartley or Weaver image rejection techniques or by the use of complex analog bandpass filters. However, these architectures suffer from poor to moderate image rejection due to quadrature gain and phase mismatch errors in the local oscillator (LO) and signal paths. Fundamentally, these methods rely on complex signal cancellation techniques to remove the image component. However, due to manufacturing process tolerances, it is difficult to ensure quadrature gain and phase errors of better than 1-2% and 1-3 degrees respectively, which results in a typical image rejection performance of 25-30 dB.

Thus, there is a need to enhance the IR performance of low-IF receiver architectures, and still preserve the benefits of low power, low-complexity and excellent narrowband performance that the low-IF receiver architectures offers.

BRIEF SUMMARY OF THE INVENTION

It is therefore an object of this invention to provide an improved method and system for increasing image rejection.

It is a further object of this invention to provide such an improved image rejection calibration method and system for a wireless receiver.

It is a further object of this invention to provide such an improved image rejection calibration method and system which uses an inexpensive, low noise, on-chip RF calibration source.

It is a further object of this invention to provide such an improved image rejection calibration method and system which can calibrate over a very wide range of frequencies for broadband operation and yet provide a calibration RF frequency close to the wanted RF frequency.

It is a further object of this invention to provide such an improved image rejection calibration method and system which can be implemented with low power and low complexity with very little additional hardware.

It is a further object of this invention to provide such an improved image rejection calibration method and system which can be implemented in hardware or software with low complexity algorithms.

It is a further object of this invention to provide such an improved image rejection calibration method and system which applies quadrature gain and quadrature phase corrections, at the source of the quadrature gain and phase errors, thereby making the receiver performance more robust and less susceptible to temperature, process and power supply variations.

It is a further object of this invention to provide such an improved image rejection calibration method and system which can employ fast convergence algorithms that conserve power.

It is a further object of this invention to provide such an improved image rejection calibration method and system which can be mostly or completely implemented on-chip.

It is a further object of this invention to provide such an improved image rejection calibration method and system which can improve the image rejection to 50 dB or higher.

It is a further object of this invention to provide such an improved image rejection calibration method and system which improves the image rejection performance by applying a tone at the image frequency to the mixer inputs and to determine the level of image rejection by measuring the power level of the image tone at the output of the poly-phase IF filter.

It is a further object of this invention to provide such an improved image rejection calibration method and system which can use a two-dimensional SAR algorithm which interleaves the bit trials of the phase and gain registers to reach the optimum phase and gain register settings which minimizes the image signal power in the minimum number of bit trials.

It is a further object of this invention to provide such an improved image rejection calibration method and system which can use image rejection calibration algorithm which uses the minimum number of iterations to find the optimum phase and gain register settings which minimizes the image signal power.

It is a further object of this invention to provide such an improved image rejection calibration method and system which can use a gradient estimation algorithm.

The invention results from the realization that improved image rejection can be achieved in a wireless receiver by calibrating the receiver by applying to the input of the quadrature mixers in the calibration mode, an RF source, placed at the image frequency and sensing the power output from the poly-phase filter, then developing gain adjust and phase adjust values in response to the power output and adjusting, in accordance with those correction values, the gain of the quadrature signals from the quadrature mixers and the quadrature phase of the local oscillator signals from the local oscillator to the quadrature mixers to reduce the output power of the IF filter towards a minimum.

The subject invention, however, in other embodiments, need not achieve all these objectives and the claims hereof should not be limited to structures or methods capable of achieving these objectives.

This invention features an image rejection calibration system for a wireless receiver including an input amplifier for receiving a wanted RF input signal, a pair of quadrature mixers, and an RF source for providing an RF calibration signal in the frequency range of the wanted RF input signal. A switching circuit selectively connects the RF calibration signal and the wanted RF input signal to the quadrature mixers. There is a local oscillator, a quadrature phase adjust circuit responsive to the local oscillator for adjusting the phase of the outputs of the quadrature mixers, and a quadrature gain adjust circuit for adjusting the gain of the outputs of the quadrature mixers. A poly-phase filter is responsive to the gain adjust circuits for passing the wanted RF signals and attenuating image frequencies, and a power measurement circuit is responsive to the poly-phase filter for determining the power at the output of the poly-phase filter. A control circuit operates the switching circuit to selectively apply the RF source to the quadrature mixers in calibration mode and is responsive to the output of the power measurement circuit for driving, during calibration mode, the quadrature phase adjust circuit and quadrature gain adjust circuit to adjust the phase and gain, respectively, of the quadrature mixers to reduce the power of the image signal. The control circuit may adjust the RF frequency of the local oscillator to be an IF frequency above the frequency of the RF source.

In a preferred embodiment the input amplifier may include a low noise amplifier. The low noise amplifier may have a shunting switch across its input terminals. The RF source may include a clock. The RF source may include a digital divider responsive to the clock for providing a fundamental frequency and harmonic frequencies. The RF source may include a high pass filter for passing a harmonic in the range of the wanted RF input signal. The control circuit may control the signal level of the RF source. The digital divider may be programmable. The quadrature phase adjust circuit may include a programmable delay line. The local oscillator may include a fractional-N synthesizer. The quadrature phase adjust circuit may include a phase register for holding the phase adjust correction value from the control circuit. The programmable delay line may include a pair of quadrature delay lines. The quadrature gain adjust circuit may include a pair of quadrature gain adjust channels. Each channel may include a variable impedance device and a preamplifier, and a digital to analog converter, responsive to a command from the control circuit, for decreasing the impedance of one variable impedance in one channel and increasing the impedance of the other variable in the other channel The quadrature gain adjust circuit may include a gain register for holding a correction value from the control circuit. Each preamplifier may include an amplifier with a feedback impedance and an input impedance connected to its respective variable impedance device. Each variable impedance device may include a current source and a field effect transistor. The power measurement circuit may include a received signal strength indicator. The power measurement circuit may include an analog to digital converter. The power measurement circuit may include a power measurement register for holding the present power measurement available to the control circuit. The control circuit may include a processor configured to sense the measured power from the power measurement circuit and command the quadrature gain adjust circuit and quadrature phase adjust circuit to drive, toward a minimum, the power measured by the power measurement circuit. The processor may be on-chip. The processor may be a microcontroller. The RF source may include a clock, digital divider responsive to the clock and a filter for passing harmonic frequencies from the digital divider in the frequency range of the wanted RF signal and image RF signal. The digital divider may be a programmable digital divider.

This invention also features an image rejection calibration method including initializing the calibration mode by applying to quadrature mixers, in place of the wanted RF input, an RF source in the frequency range of the wanted RF input, sensing the power output from the poly-phase filter, developing gain adjust and phase adjust correction values in response to the power output and adjusting in accordance with the correction values the gain of the quadrature signals from the quadrature mixers to the poly-phase filter and the phase of local oscillator quadrature signals from the local oscillator to the quadrature mixers to reduce the power output.

In a preferred embodiment developing gain adjust and phase adjust correction values may include executing a successive approximation register algorithm or may include executing a gradient/slope estimation algorithm.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
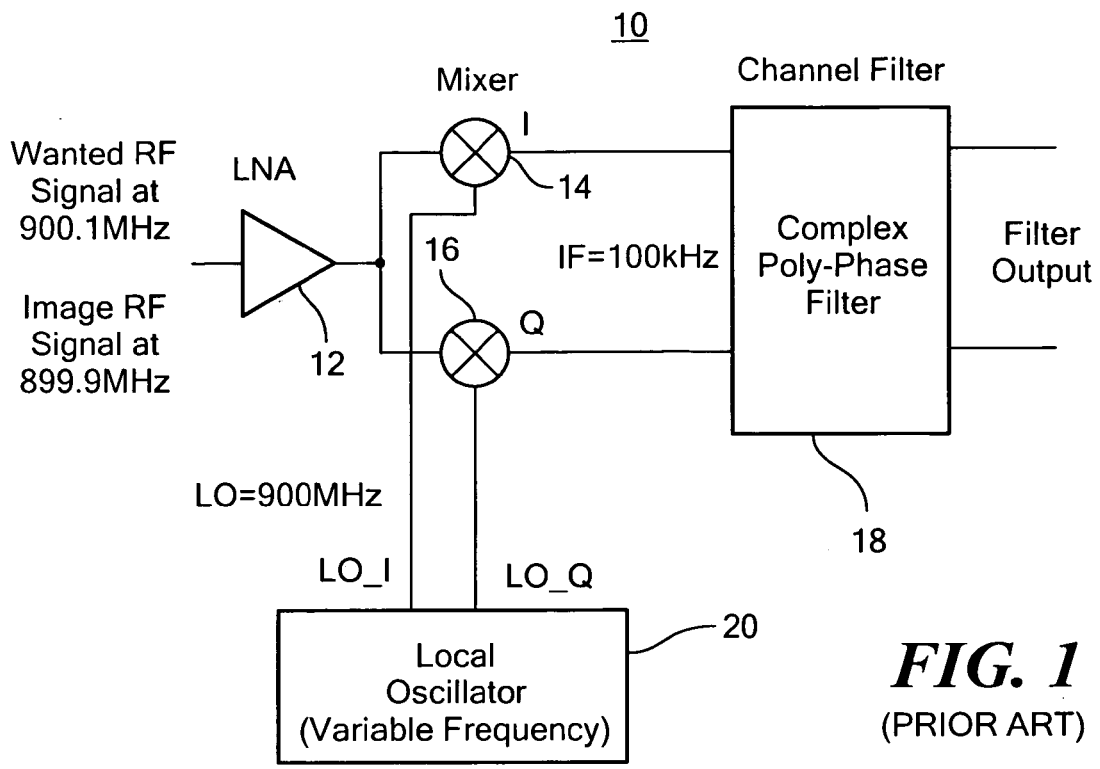
FIG. 1 is a schematic diagram of a prior art low IF receiver.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The calibration system and method of this invention is applicable for a wide range of wireless receiver architecture, e.g. heterodyne mixing circuits in radio receivers. One example of a typical receiver with which this invention may be used is a prior art low IF receiver 10, FIG. 1, which includes an input, low noise amplifier 12 which normally provides the wanted RF signal, for example, 900.1 MHz, to quadrature mixers 14 and 16 that provide the I and Q inputs to complex poly-phase filter 18. An intermediate frequency (IF) of 100 kHz is produced at the quadrature mixer outputs using local oscillator 20, which has a frequency, for example, of 900 MHz. The unwanted image frequency appears in this example at 899.9 MHz, located at a frequency that is equal to the frequency of the wanted signal minus two times the IF frequency. An alternate implementation which can also be used is to operate the local oscillator at an IF frequency above the wanted frequency and in this case the image component will be located at a frequency that is equal to the frequency of the wanted signal plus two times the IF frequency.

Figure 2:
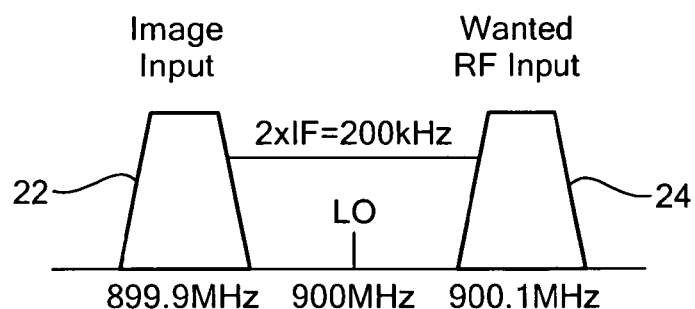
FIG. 2 is an illustration of the image signal and wanted RF signal at the low noise amplifier input and mixer outputs for the low IF receiver of FIG. 1.
Figure 2:
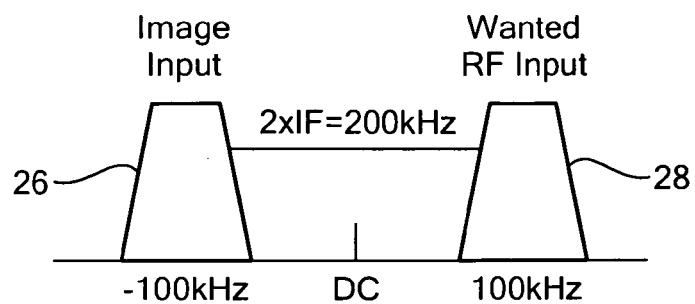
Figure 3:
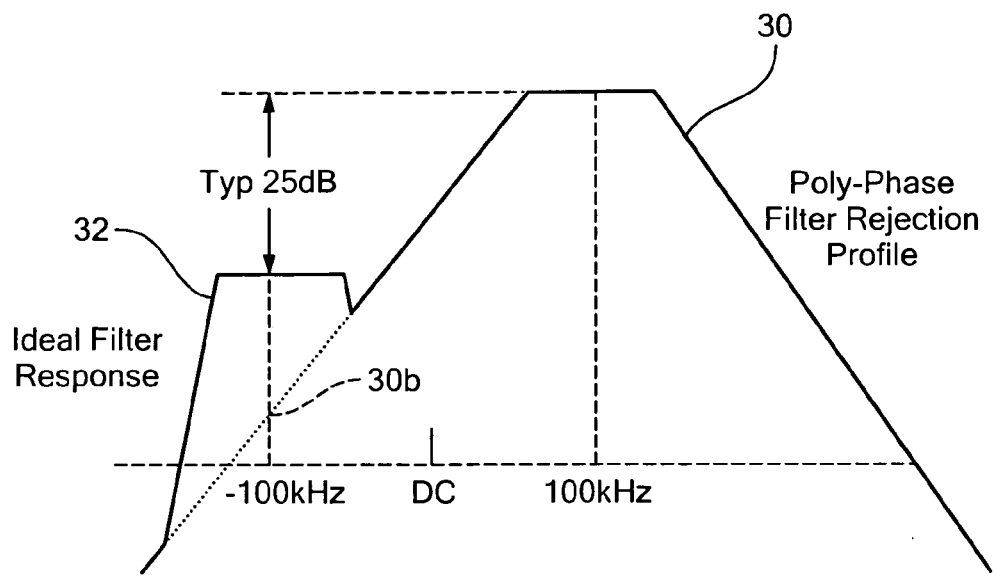
FIG. 3 is an illustration of the poly-phase filter rejection profile for the low IF receiver of FIG. 1.
Figure 4:
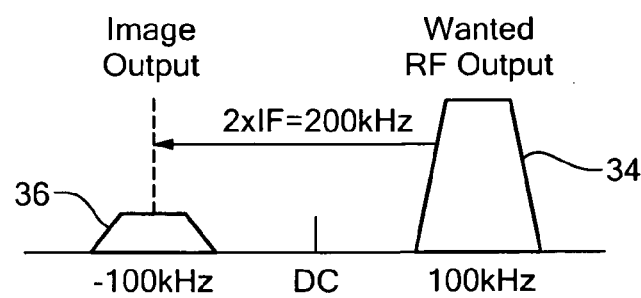
FIG. 4 is an illustration of the image signal and wanted RF signal at the poly-phase filter output in FIG. 1.

The image RF input can appear at a higher power 22, FIG. 2, than the wanted RF input 24 at the output of low noise amplifier 12. Likewise the image input 26 to poly-phase filter 18 from quadrature mixers 14 and 16 can have higher power than the wanted RF input 28. Ideally poly-phase filter 18 should have a symmetrical rejection profile 30b, that is centered on the wanted channel at +100 kHz, FIG. 3. However, practically speaking, due to manufacturing process tolerances, the filter response is such that at the minus 100 kHz frequency, the image signal is typically only attenuated by 25 dB as shown as 32. The result is that, if the input power level of the image signal 22 increases by 25 dB or more, relative to the wanted RF input signal 24 in FIG. 2, the power level of the unwanted image signal 36 will become comparable to, or greater than, the wanted signal 34 at the poly-phase filter's output in FIG. 4 and this will cause a substantial degradation in the receiver's performance and will inhibit reception of the wanted signal.

Figure 5:
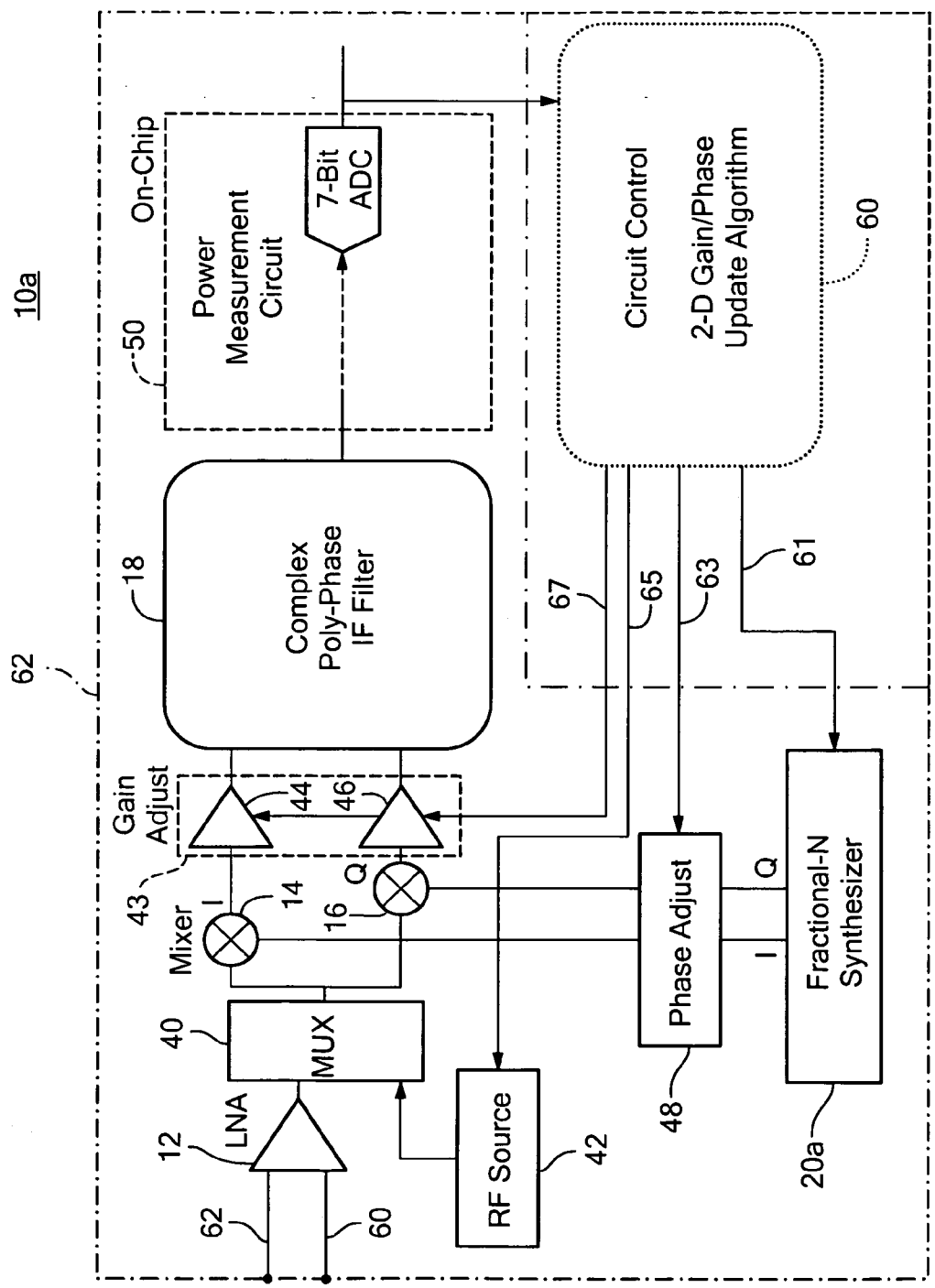
FIG. 5 is a schematic diagram for a receiver with a calibration system according to this invention.

In accordance with this invention an image rejection calibration system 10a, FIG. 5, includes a sampling mux 40 and an RF source 42. There is also a gain adjust circuit 43 including two channels 44 and 46 and a phase adjust circuit 48. Also shown is a power measurement circuit 50 which may include an analog to digital converter 58. The local oscillator here is implemented with a fractional-N synthesizer 20a but an integer-N RF synthesizer can also be used in some applications. There is also a control circuit 60 which may be on chip 62 or not. It may be a microprocessor or microcontroller or it may be an on-chip dedicated hardware circuit or a device such as a digital signal processor (DSP) or field programmable gate array (FPGA). Low noise amplifier 12, FIG. 5, is shown as having dual inputs 62 and 64. This indicates that the entire system deals with a differential signal set but the remainder of the circuit is shown with single ended schematic indications in order to simplify the drawing.

In operation to initialize the calibration mode, control circuit 60 commands mux 40 to deliver a signal from RF source 42 to quadrature mixers 14 and 16 instead of the normal wanted RF signal from low noise amplifier 12. Command/request for calibration can come from an external source or it can be self timed in control circuit 60. The signal from RF source 42 is in the same frequency range as the image and wanted RF signals. With this signal close to the frequency of the wanted RF signal and the image RF signal delivered to quadrature mixers 14 and 16, the quadrature signals at the output of the mixers 14 and 16 will contain a signal representing the image component at minus 100 kHz IF frequency. The output of filter 18 is monitored by analog power measurement circuit 50 to determine the power of that signal, which is a measurement of how well the image component at minus 100 kHz has been attenuated by the IF filter 18. The power is converted using an N bit ADC, in this case, to a seven bit digital code which is delivered to control circuit 60. Control circuit 60 using an optimization algorithm such as a modified successive approximation register (SAR) algorithm or a gradient estimation algorithm then applies a phase correction value to phase adjust circuit 48 and a gain correction value to gain adjust circuit 43. The process is iterative during the calibration mode so that the power output measured by power measurement circuit 50 is reduced over and over again toward a minimum which is typically 50 to 60 dB's down from the wanted RF signal. Control circuit 60 provides control signals to fractional-N synthesizer 20a, phase adjust circuit 48, RF source 42, and gain adjust circuit 43 over lines 61, 63, 65, 67, respectively.

Figure 6:
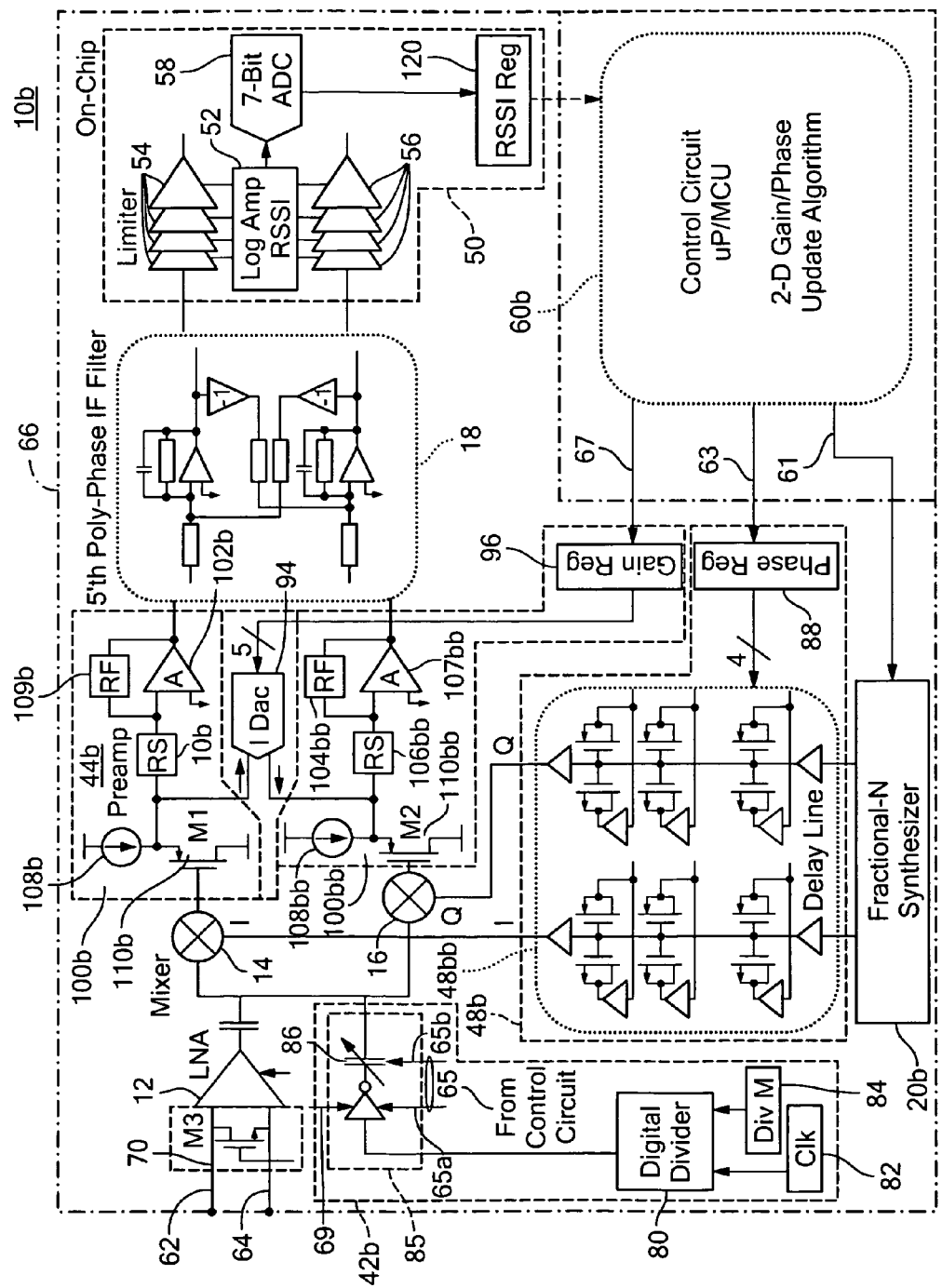
FIG. 6 is a more detailed schematic diagram of the receiver of FIG. 5.

A further specific embodiment 10b, FIG. 6, shows low noise amplifier 12 including a shunting switch 70 across the input terminals 62, 64. During calibration mode this shunting transistor 70 is made to conduct so that no external signals at the receiver's antenna can be introduced through low noise amplifier 12 and in compliance with government regulators no stray transmissions can occur from the RF source 42b to the receiver's antenna.

RF source 42b in this specific embodiment includes a digital divider 80 which may be a programmable digital divider that divides the input from crystal clock 82 by a programmable factor M, 84. RF source 42b also includes an inverter 85 and a high-pass filter 86 which attenuates low frequency components at the output of digital divider 80 and only permits high frequency harmonics of the output of digital divider 80 to pass through to mixer inputs 14 and 16. High pass filter 86 also includes an input for controlling the signal level of the RF source during calibration by changing the coupling capacitor in the high pass filter 86 or by changing the buffer drive strength in high pass filter 86 which may come from control circuit 60b which also may provide the enable signal to inverter 85. Calibration control circuit 60b also programs the digital divider 80 input from a programmable factor M, 84 so that a harmonic of the output of the programmable digital divider 80 frequency is close to the RF band of operation of the receiver. Calibration control circuit 60b also programs the fractional-N RF synthesizer using control signal 61 so that its output frequency is equal to the frequency of the RF source plus the receivers IF frequency. Input 65 actually includes an enable input 65a to turn on and off inverter 85 and an input 65b to vary the capacitance of variable filter 86.

RF source 42b provides a stable high frequency RF signal for calibration purposes at very low power and at very low cost and this does not require the use of a dedicated RF synthesizer or require the use an external RF source for the purposes of calibration. The gain may be controlled either by varying the capacitance of variable capacitor 86 or changing the drive strength on the input 69 driven by control circuit 60b. Inverter 85 may also be digital buffer.

This approach derives the RF source by using the harmonics that are present in the square wave output from digital divider 80. For example, to calibrate at an RF frequency of 905 MHz and using a 10 MHz crystal reference 82, divider M, 84 is programmed to select a divide by two which results in a 5 MHz clock output from digital divider 80. The RF source 42 will have a low level spectral component at the $181^{st}$ harmonic of this square wave 5 MHz output at 905 MHz which is applied to mixer inputs 14 and 16. Fractional-N RF synthesizer 20b is then adjusted to 905.1 MHz and the quadrature signals at the output of the mixers 14 and 16 will then contain a signal representing the image component at minus 100 kHz IF frequency and the output of filter 18 is monitored by analog power measurement circuit 50 to determine the power of that signal, which is a measurement of how well the image component at minus 100 kHz has been attenuated by the IF filter 18.

In addition, to support different RF bands and different RF frequencies, the programmable divider factor M can be changed and an appropriate harmonic frequency can be selected for RF calibration source 42b that is close to the RF frequency of operation of the receiver. This permits a wide range of RF frequencies, located at integer multiples of the divided clock output 80 to be obtained during a calibration phase, at the output of RF source 42b and IR calibration can be implemented at discrete RF frequencies that typically range from a few tens of megahertz to several gigahertz on the same device.

Also in FIG. 6, the phase adjust circuit 48b is shown as implemented with a conventional programmable delay line 48bb, gain adjust circuit 43b includes two channels 44b, 44bb and a digital to analog converter 94 and gain register 96. Phase adjust circuit 48b also includes a phase register 88 where the phase adjust value from control circuit 60b is held. Gain adjust circuit 43b includes gain register 96 which holds the gain adjust value from control circuit 60b. In gain adjust circuit 43b channels 44b and 44bb correspond to the I and Q quadrature channels.

Channel 44b includes a variable impedance device 100b and an amplifier 102b with a feedback resistance 104b and series resistance 106b. Variable impedance 100b may include a fixed current source 108b and a field effect transistor such as CMOS transistor 110b, operating as a signal buffer. Channel 44bb contains all the same elements as indicated by the same reference numerals accompanied by a second b. Power measurement circuit 50 may include a received signal strength indicator (RSSI) or log amplifier 52 with attendant amplifiers 54, 56 or could be done in software or digital hardware.

In operation when a gain adjust value is present in gain register 96, DAC 94 may sink current on line 112b and deliver current on line 112bb or it may sink current on line 112bb and deliver current on line 112b. The change in current at transistors 110b and 110bb changes their transconductance which changes their output impedance. Their change in output impedance effects the input resistance associated with the amplifier 102b, 102bb, which changes the amplifier gain. The gain is expressed as a function of RF/(RS+RV), where RV is the variable impedance 100b, 100bb and RF and RS are the feedback and input resistors of the amplifiers. A power measurement register or RSSI register 120 is included in power measurement circuit 50, FIG. 6, and control circuit 60b here is shown as employing a microprocessor or microcontroller unit. And, again, may or may not be on-chip 62 with the rest of the components. If it is on-chip it may be implemented as a dedicated hardware configuration. If control circuit 60b is off-chip registers such as 88, 96, 120 could be used on lines 61, 65 and 69 as well. If control circuit 60b is on-chip the lines could be direct as are lines 61, 65, 69 and registers such as 88, 96, 120 need not be provided.

The signal level of the RF calibration source at the output of circuit 42b can also be adjusted by the control circuit 60b during the calibration process by gain control signals 69 and 65b. This ensures that signal levels at the outputs of the quadrature mixers 14, 16 and IF filter 18 are not saturated during the calibration process. In addition, the gain control circuit also permits IR calibration to be implemented over a wide range of signal levels such that the receiver's IR performance can be optimized over the maximum and minimum power level of the external interfering image signal.

Figure 7:
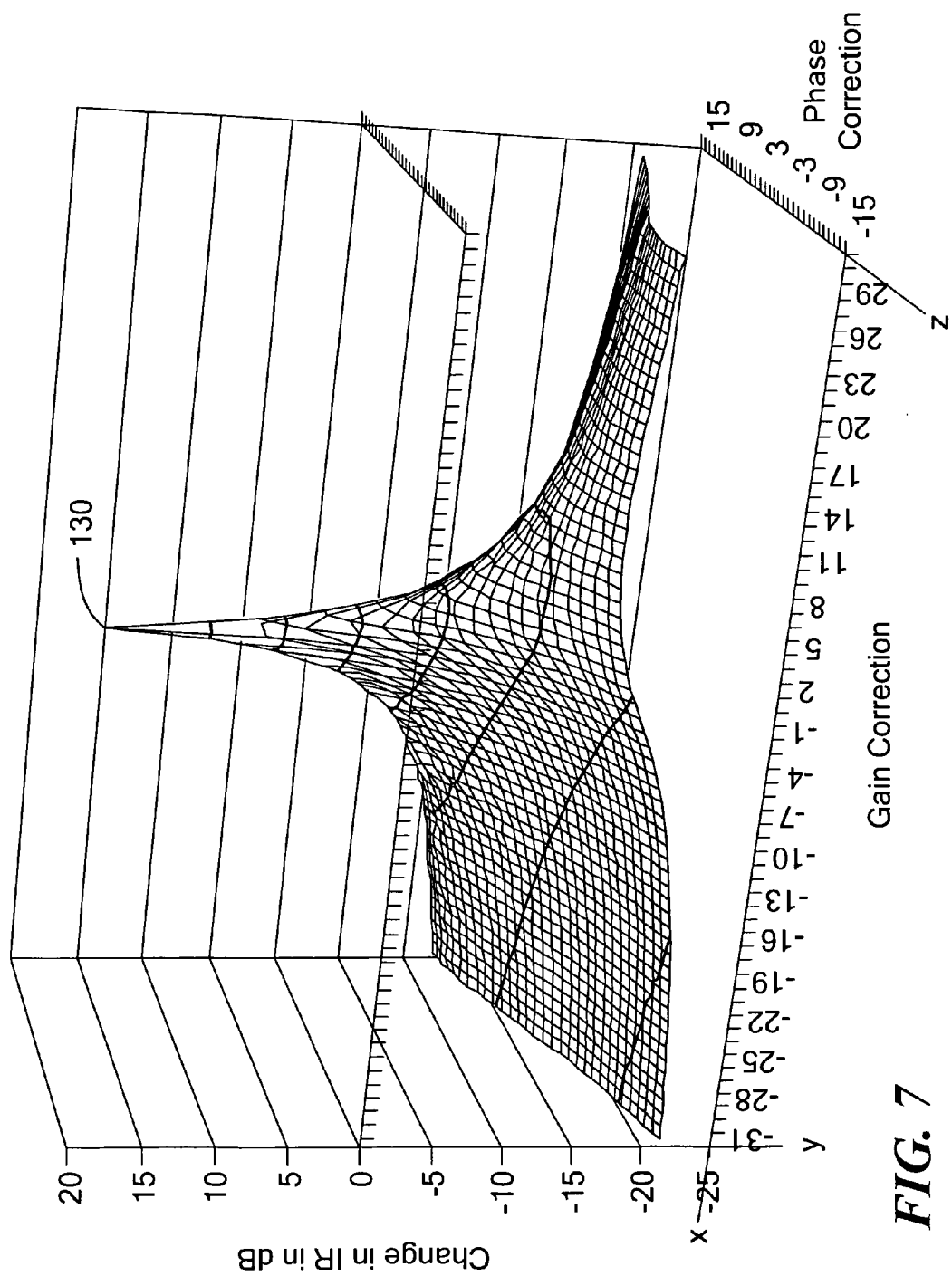
FIG. 7 is a three dimensional illustration of image rejection performance versus quadrature gain/phase correction according to this invention.

The image rejection performance of such a system in accordance with this invention is depicted in FIG. 7, where the image rejection or change in IR in dB is plotted on the Y axis while the necessary quadrature gain correction is depicted on the X axis and the quadrature phase correction on the Z axis. In this specific instance it can be seen that a gain correction of −6 accompanied by a phase correction of +3 give the optimum change in image rejection in dB at 130.

Figure 8:
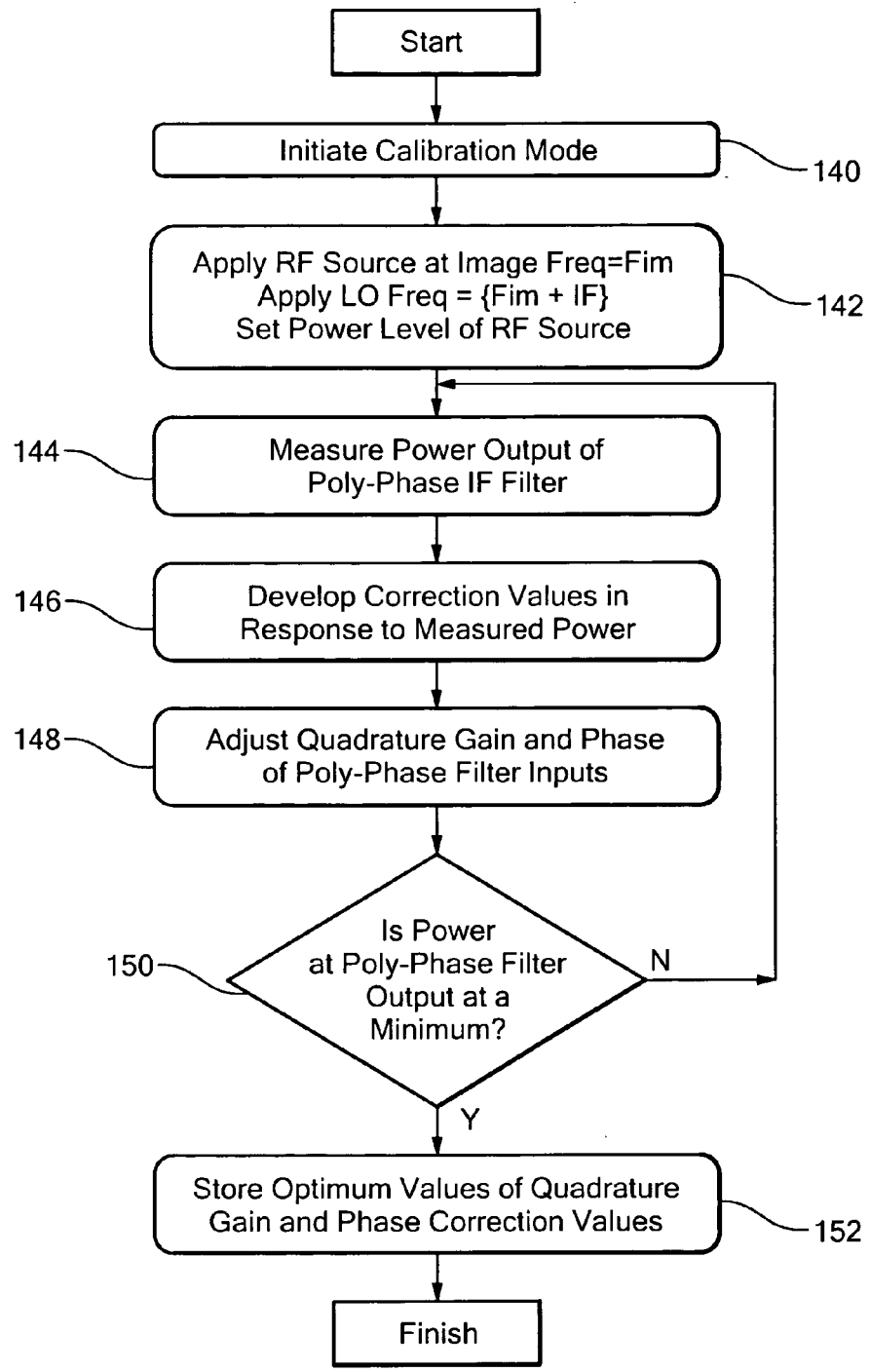
FIG. 8 is a flow chart of the calibration method of this invention.

The method according to this invention depicted in FIG. 8 is a general algorithm of the calibration procedure. It begins with the initiation of the calibration mode 140 after which the RF source in the frequency range of the wanted RF and image signals are applied to the quadrature mixers 142 and using a control signal, the local oscillator frequency is set to be an IF frequency above the image frequency of the RF source 42. The power level of the RF source is adjusted to a predetermined level using gain control signals. The power output from the poly-phase IF filter is then sensed 144 and the controller circuit then computes correction values 146 to adjust phase and gain of quadrature signals delivered to the poly-phase IF filter 148.

The measured IF filter output power is then compared to a pre-determined minimum value 150. If the IF filter output power is greater than the pre-determined minimum value, the controller iterates procedures 144, 146, 148 and 150 until the measured IF filter output power is below the pre-determined minimum value, after which, the optimum values of quadrature gain and phase are stored 152 and used in normal operation of the receiver. The calibration procedure improves the overall receiver's image rejection to typically 50-60 dB.

Figure 9:
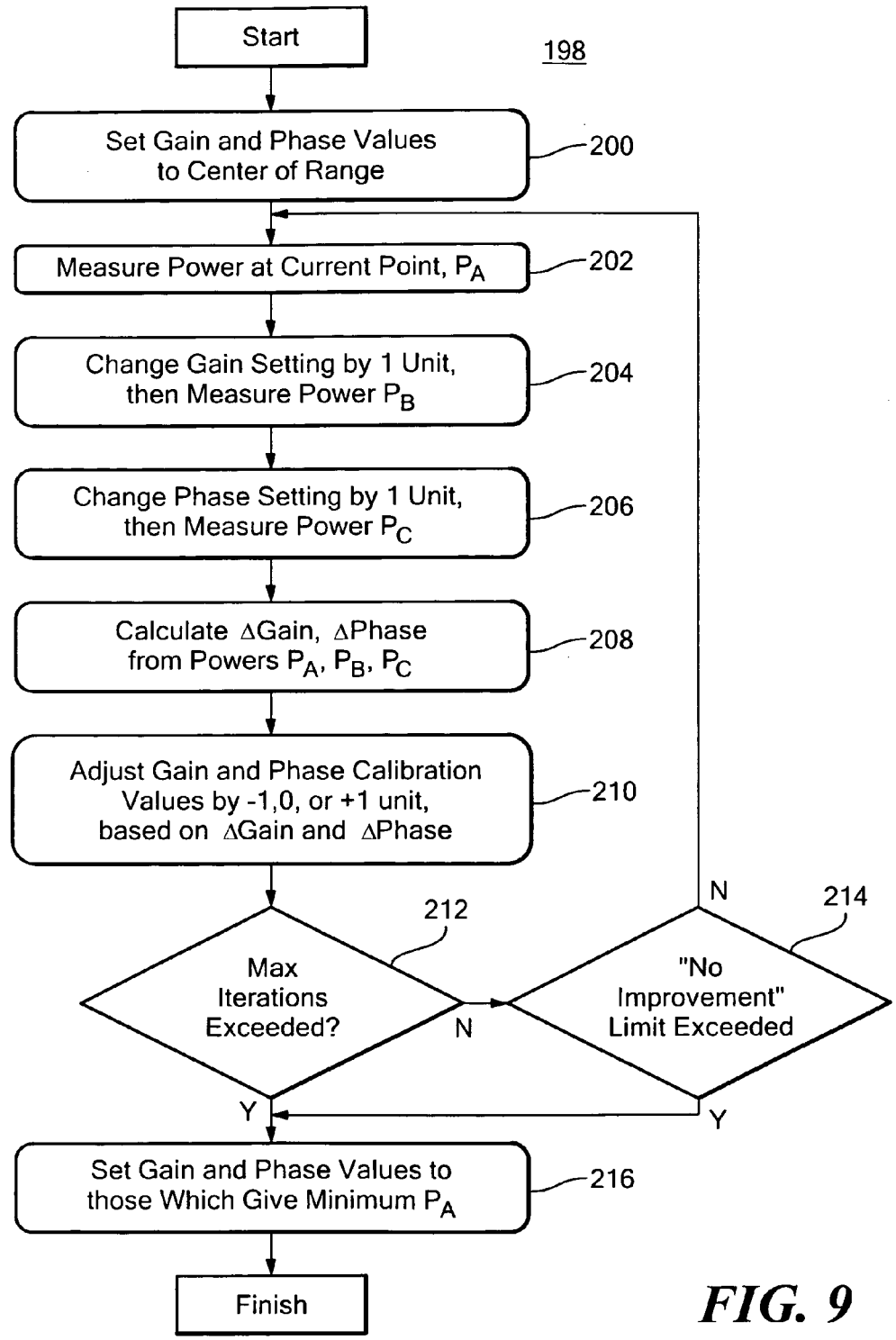
FIG. 9 is a flow chart of one algorithm for developing the gain and phase adjust correction values according to this invention.
Figure 10:
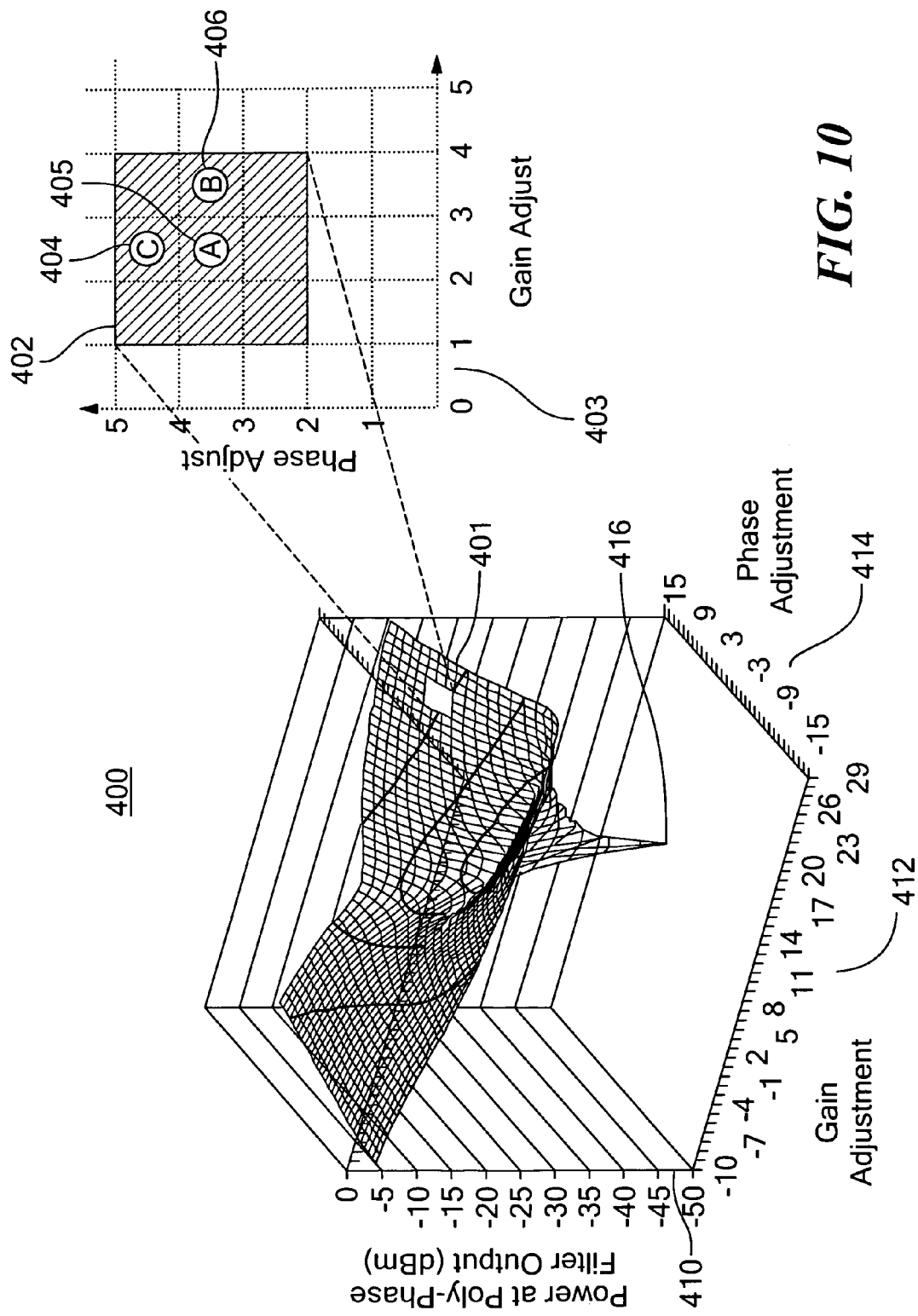
FIG. 10 is a three dimensional illustration of the power of the image signal at the poly-phase filter output versus gain and phase adjustment values.

FIG. 9 shows a slope or gradient estimation algorithm 198, for updating the quadrature gain and phase correction values. A gradient estimation algorithm develops gain and phase correction values through an iterative search where each iteration calculates the localized slope or gradient of power output measurements about a point A, and each iteration moves the point A closer to the optimum gain and phase adjustment values. It is based on measuring the incremental gradient or slope of the 2-dimensional array of poly-phase filter output power versus quadrature gain and phase values. The complete array of phase adjustment and gain adjustment values comprise a 2-dimensional field, where each unique set of gain and phase adjustment values represents a point in that field. This field is drawn as the X axis 412 and Z axis 414 of the 3-dimensional plot 400 on FIG. 10. Each unique set of gain and phase adjustment values may be applied to the poly-phase filter, causing the poly-phase filter to offer a level of image rejection specific to that pair of adjustment values. The power of a signal at the image frequency may be plotted on a Y axis 410 against the full array of gain and phase adjustment values, to give a 3-dimensional plot in isometric view 400.

The point of maximum image rejection is the point of minimum power from the image calibration source, and may be observed as minimum 416 on the 3-D plot 400. The gain and phase adjustment values for maximum image rejection correspond to the X and Z axis coordinates on plot 400 which result in the minimum Y axis value. In each iteration the algorithm operates on a small subset of the total surface shown as the box 401. The box 401 is drawn as a square 402 in the 2 dimensional diagram 403 which is a vertical projection of 400. The X axis 412 and Z axis 414 of 3-D plot 400 are drawn as X and Y axes of 2-D plot 403, and used as array coordinates where each point in the array 403 contains the value plotted on the Z axis 410 of the 3-D plot 400. As the algorithm iterates, the box 402 may be centered on any coordinate in the array of gain and phase adjustment values, as the point A 405 is moved closer to the optimum point 416.

The algorithm of FIG. 9 begins by setting the poly-phase filter gain and phase adjustment values to the centre of their range to set up the initial conditions 200 before iteratively searching for optimum adjustment values. The gain and phase adjustment values set in 200 or 210 represent a point A 405 in the array of all possible adjustment values. The power output from the poly-phase filter is measured and stored in a variable $P_A$ 202 using gain and phase values set in 200 or 210. The gain adjustment value of the poly-phase filter is then incremented by 1 unit to represent point B 406 in the array of adjustment values, the power output from the poly-phase filter is measured and stored in variable $P_B$ 204. Next, the phase adjustment value of the poly-phase filter is incremented by 1 unit to represent point C 404 in the array of adjustment values, the power output from the poly-phase filter is measured and the power stored in variable $P_C$ 206. The localized slope of the array of adjustment values is then calculated in 208 based on the powers measured at points A, B and C. The slope of the array is stored in 2 dimensional Cartesian form in the variables ΔGain and ΔPhase. The slope ΔGain is used to determine if the poly-phase gain adjustment should be increased or decreased by 1 or more units. Similarly, the slope ΔPhase is used to determine if the poly-phase phase adjustment should be increased or decreased by 1 or more units 210. Based on these decisions the gain and phase adjustment values are set to any point within the box 402, which will become the point A in the next iteration of the algorithm. The adjustments 210 should give an incremental improvement in the image rejection of the poly-phase filter, and move point A 405 incrementally closer to optimum 416. The steps 202 to 210 represent the body of an iteration of this algorithm.

If the number of iterations completed exceeds a threshold then no more iterations are performed 212. If the number of previous iterations of 202 to 210 which have not yielded any improvement in $P_A$ exceeds a threshold, then no more iterations are performed 214. If neither limit 212, 214 is exceeded the algorithm loops back to measure power at a new point A 202. Before completion, the poly-phase gain and phase adjustment values are set to those with resulted in the lowest measured $P_A$.

The location of points B 406 and C 404 within box 402 is not critical. As long as they are placed orthogonally to each other then the localized slope may be calculated. Points B and C may be placed more than one unit away from point A to allow more accurate calculation of the slope. The adjustment of the gain and phase adjustment values may be performed in increments greater than one unit to effectively reduce the search space and allow faster convergence of the algorithm toward the minimum 416. Averaging of successive measurements may also be used in steps 202, 204, 206 to improve the accuracy of the image power measurement in the presence of noise.

Figure 11:
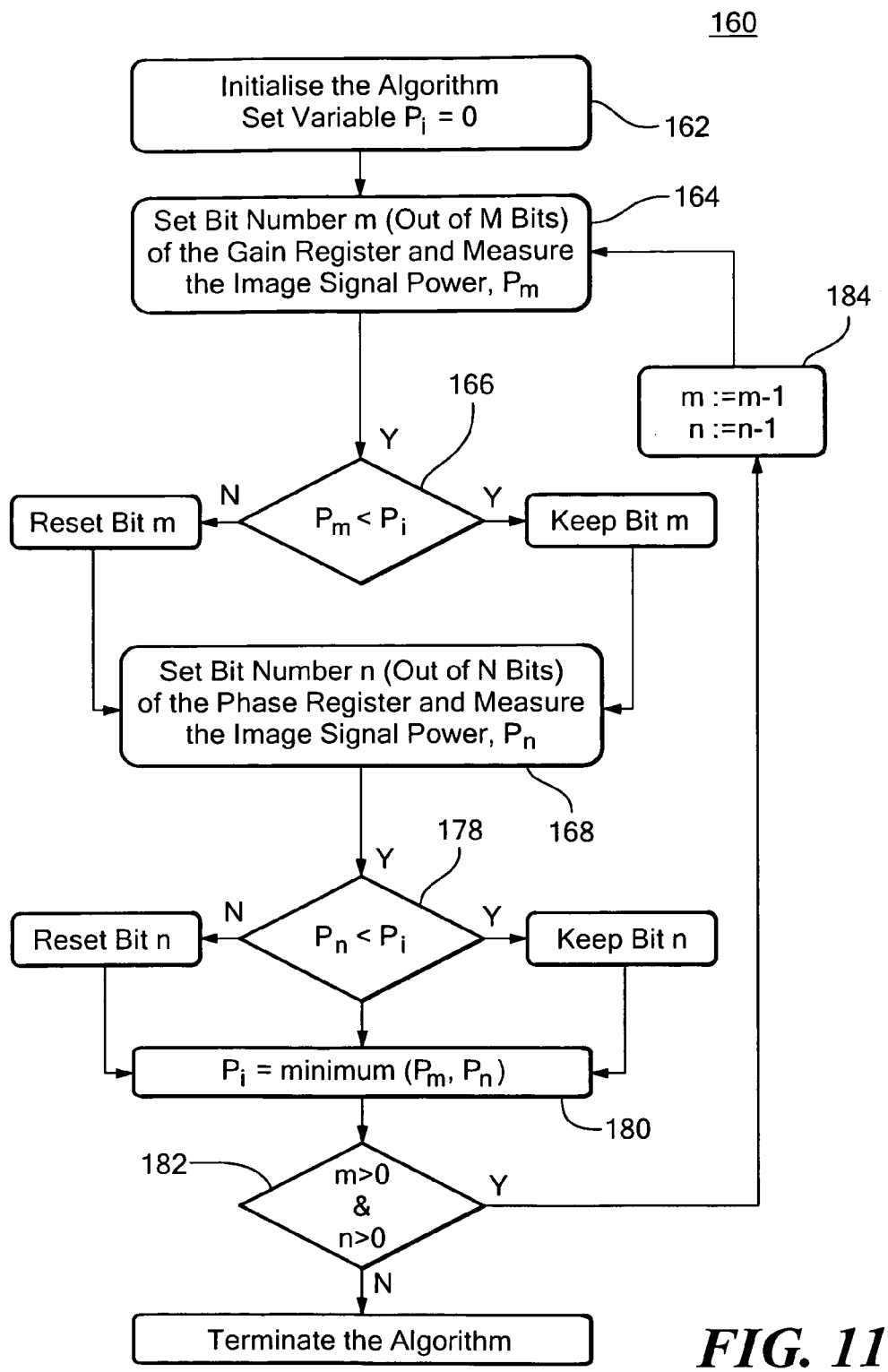
FIG. 11 is a flow chart of another algorithm for developing the gain and phase adjust correction values according to this invention.

FIG. 11 shows another algorithm 160 for updating the quadrature gain and phase correction values. The algorithm is based on a Successive Approximation Register (SAR) algorithm, operating on two variables; the quadrature phase and quadrature gain correction registers. In general, the 2-D SAR algorithm, performs "bit-trials" by setting logic bits of the gain or the phase registers to logic 1 and then examining the effect of setting this bit on the IF filter's output power during IR calibration. The algorithm operates on the gain and the phase registers in two dimensions by interleaving the gain and the phase register bit trials. In step 162, a variable Pi is defined and is used to represent the minimum IF filter output power measured during the calibration procedure. In this step 162, Pi is initialized to zero. The suffix i indicates the index number of the logic bit of the gain or phase registers where i=0, 1, 2, up to the maximum of M and N. In the next step 164, bit number m of the gain register is set to logic 1 and the IF filter's output power is measured and stored in variable $P_m$. The suffix m is the index number for the bit in the gain register that is being tested. Initially m is set equal to M and m has a numeric range: M, M−1, M−2 . . . 1, 0. In step 166, the IF filter power measured in step 164 is compared to the power stored in the variable Pi. If the condition that Pm<Pi is true, bit m of the gain register is kept as logic 1. If the condition Pm<Pi is false then bit m of the gain register is reset to logic 0. In step 168, bit number n of the phase register is set to logic 1 and the IF filter's output power is measured and stored in variable $P_n$. The suffix n is the index number for the bit in the phase register that is being tested. Initially n is set equal to N. n has a numeric range: N, N−1, N−2 . . . 1, 0. In step 178, the power of the image signal Pn is compared to the power stored in the variable Pi. If the condition that Pn<Pi is true, bit n of the phase register is kept at logic 1. If the condition Pn<Pi is false then bit n of the phase register is reset to logic 0. In step 180, the variable Pi is assigned the minimum of the two power measurements Pm and Pn. Pi=min (Pm, Pn). In step 182, if all the bits of the gain register and all the bits of the phase register, have been tested, i.e., the variables m and n are both zero, the algorithm terminates, otherwise, the algorithm moves to step 184. In step 184, the variables m and n are both decremented by 1, indexing the next gain and phase register bits to be tested. After step 184, the algorithm returns to step 164 and the algorithm is repeated again until all the bits of the gain and phase registers have been tested. When all bits of the gain and phase registers have been tested the algorithm terminates and the values obtained in quadrature gain and phase registers represent the optimum values that provide maximum Image Rejection. These settings are stored and used during normal operation of the device.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An image rejection calibration system for a wireless receiver comprising:
    an RF source for providing an RF calibration signal in the frequency range of said wanted RF input signal;
    a switching circuit for selectively connecting said RF calibration signal and said wanted RF input signal to quadrature mixers;
    a quadrature phase adjust circuit responsive to a local oscillator for adjusting the phase of the outputs of said quadrature mixers;
    a quadrature gain adjust circuit for adjusting the gain of the outputs of said quadrature mixers, said quadrature gain adjust circuit includes a pair of quadrature gain adjust channels, each channel including a variable impedance device and a preamplifier, and a digital to analog converter, responsive to a command from said control circuit, for decreasing the impedance of one variable impedance in one channel and increasing the impedance of the other variable in the other channel;
    a filter responsive to said gain adjust circuits for passing the wanted RF signals and attenuating image frequencies;
    a power measurement circuit responsive to said filter for determining the power at the output of said filter; and
    a control circuit for operating the switching circuit to selectively apply said RF source to said quadrature mixers in calibration mode and is responsive to the output of the power measurement circuit for driving, during calibration mode, the quadrature phase adjust circuit and quadrature gain adjust circuit to adjust the phase and gain, respectively, of the quadrature mixers to reduce the power of the image frequency.

2. The image rejection calibration system of claim 1 in which said quadrature gain adjust circuit includes a gain register for holding a correction value from said control circuit.

3. The image rejection calibration system of claim 1 in which each said preamplifier includes an amplifier with a feedback impedance and an input impedance connected to its respective variable impedance device.

4. The image rejection calibration system of claim 1 in which each said variable impedance device includes a current source and a field effect transistor.

5. An image rejection calibration system to calibrate circuitry in a wireless receiver to pass a wanted radio frequency (RF) input signal and attenuate image frequencies comprising:
    an RF source that is configured to generate a harmonic frequency that provides an RF calibration signal in a frequency range of said wanted RF input signal, wherein said RF source includes:
        a clock that is configured to generate a reference clock signal, and
        a divider that receives the reference clock signal and is configured to divide the reference clock signal to provide a fundamental frequency and harmonic frequencies as an output, wherein at least one of the harmonic frequencies is in the frequency range of said wanted RF input signal;
    a mixing circuit that receives the harmonic frequency from the RF source and provides a mixed signal that includes the harmonic frequency from the RF source and an oscillator signal from an oscillator; and
    a control circuit that applies the mixed signal in a calibration mode to filter circuitry to measure a power output of the filter circuitry and based on the power output measurement to adjust a phase and a gain of an input signal to the filter circuitry to reduce power of an image frequency.

6. The image rejection calibration system of claim 5, further comprising an input for receiving the wanted RF input signal and a shunting switch coupled across the input to suppress introduction of external signals during the calibration mode.

7. The image rejection calibration system of claim 5, wherein the divider is a programmable digital divider that divides the reference clock signal by a programmable divider factor to generate the fundamental frequency and harmonic frequencies, and the programmable divider factor is adjustable to generate an appropriate harmonic frequency to be selected for RF calibration.

8. The image rejection calibration system of claim 5, wherein the control circuit includes a processor that is configured to control a signal power level of the RF source to prevent the mixing circuit and filter circuitry from being saturated during calibration.

9. The image rejection calibration system of claim 5, wherein the mixed signal has a frequency equal to a frequency difference between the RF calibration signal and the oscillator signal.

10. The image rejection calibration system of claim 5, wherein the mixing circuit includes a pair of quadrature mixers and wherein the oscillator includes a fractional-N synthesizer.

11. The image rejection calibration system of claim 5, further comprising a quadrature phase adjust circuit coupled to the oscillator to adjust the phase of the input signal to the filter circuitry, wherein the quadrature phase adjust circuit includes a phase register for holding a phase adjust correction value from the control circuit.

12. The image rejection calibration system of claim 5, further comprising a quadrature phase adjust circuit coupled to the oscillator to adjust the phase of the input signal to the filter circuitry, wherein phase adjust circuit includes a programmable delay line.

13. The image rejection calibration system of claim 5, further comprising a quadrature gain adjust circuit coupled to an output of the mixing circuit to adjust the gain of the input signal to the filter circuitry, wherein the quadrature gain adjust circuit includes a quadrature gain adjust channel that further includes a variable impedance device that controls the impedance on the gain adjust channel.

14. The image rejection calibration system of claim 5, further comprising a power measurement circuit that includes a received signal strength indicator.

15. The image rejection calibration system of claim 5, further comprising:
   an input for receiving the wanted RF input signal and a shunting switch across the input to suppress introduction of external signals during the calibration mode;
   a switching circuit for selectively connecting the RF calibration signal and the wanted RF input signal to the mixing circuit;
   a quadrature phase adjust circuit coupled to the oscillator for adjusting the phase of the input signal to the filter circuitry;
   a quadrature gain adjust circuit coupled to the mixing circuit for adjusting the gain of the input signal to the filter circuitry;
   wherein the filter circuitry includes a poly-phase filter for passing the wanted RF signals and attenuating image frequencies; and
   a power measurement circuit coupled to the poly-phase filter for determining the power at an output of said poly-phase filter.

16. The image rejection calibration system of claim 5, further comprising:
   a register for storing gain and phase adjustment values and for storing power output values; and
   a processor in the control circuitry that iteratively adjusts the gain and phase values based on prior values stored in the register.

17. The image rejection calibration system of claim 5, further comprising:
   a register for storing gain and phase adjustment values and for storing power output values; and
   a processor in the control circuitry that iteratively adjusts the gain and phase values based on prior values stored in the register to calculate a localized slope and to adjust the gain and phase values to improve image rejection and reduce power.

18. An image rejection calibration method for calibrating circuitry in a wireless receiver to pass a wanted radio frequency (RF) input signal and attenuate image frequencies, comprising:
   generating a harmonic frequency that provides an RF calibration signal in a frequency range of the wanted RF input signal, wherein the RF calibration signal is generated by:
      generating a reference clock signal, and
      dividing the reference clock signal to provide a fundamental frequency and harmonic frequencies as an output, wherein at least one of the harmonic frequencies is in the frequency range of the wanted RF input signal;
   mixing the harmonic frequency from the RF source and an oscillator signal from an oscillator to provide a mixed signal; and
   applying the mixed signal in a calibration mode to filter circuitry to measure a power output of the filter circuitry and based on the power output measurement to adjust a phase and a gain of an input signal to the filter circuitry to reduce power of an image frequency.

19. The image rejection calibration method of claim 18, wherein to adjust the phase and gain of the input signal to the filter circuitry includes executing a successive approximation register algorithm, wherein the successive approximation register algorithm further includes the steps of:
   setting a quadrature phase correction register and a quadrature gain correction register to a first value; and
   examining the effect of the setting using the first value on the power output during calibration.

20. The image rejection calibration method of claim 18, wherein to adjust the phase and gain of the input signal to the filter circuitry includes executing a gradient/slope estimation algorithm, wherein the gradient/slope estimation algorithm uses an iterative search and wherein each iteration of the iterative search calculates a localized slope or gradient of power output measurements.

21. The image rejection calibration method of claim 18, further comprising shunting an input of the calibration circuitry during calibration mode to suppress introduction of external signals during the calibration mode.

22. The image rejection calibration method of claim 18, further comprising adjusting a divide factor when dividing the reference clock signal to generate an appropriate harmonic frequency to be selected for RF calibration.

23. The image rejection calibration method of claim 18, further comprising controlling with a processor a signal power level of the RF calibration signal to prevent a mixing circuit and the filter circuitry from being saturated during calibration.

24. The image rejection calibration method of claim 18, wherein the mixed signal has a frequency equal to a frequency difference between the RF calibration signal and the oscillator signal.

25. The image rejection calibration method of claim 18, wherein the mixing is performed by a pair of quadrature mixers, wherein the dividing is performed by a programmable digital divider, and wherein the generating is performed by a clock.

26. The image rejection calibration method of claim 18, further comprising adjusting the phase of the input signal using a quadrature phase adjust circuit and storing a phase adjust correction value from a prior adjustment.

27. The image rejection calibration method of claim 18, further comprising adjusting the phase of the input signal using a quadrature phase adjust circuit and setting a delay on a programmable delay line of the quadrature phase adjust circuit.

28. The image rejection calibration method of claim 18, further comprising adjusting the gain of the input signal using a quadrature gain adjust circuit coupled to an output of the mixing circuit and varying impedance of a channel of the quadrature gain adjust circuit.

29. An image rejection calibration system to calibrate circuitry in a wireless receiver to pass a wanted radio frequency (RF) input signal and attenuate image frequencies, comprising:
   means for generating a reference clock signal;
   means for dividing the reference clock signal to provide a fundamental frequency and harmonic frequencies as an output, wherein at least one of the harmonic frequencies is in a frequency range of the wanted RF input signal;
   means for mixing the at least one of the harmonic frequencies in the frequency range of the wanted RF input signal and a signal from an oscillator; and
   means for apply the mixed signal in a calibration mode to filter circuitry to measure a power output of the filter circuitry and based on the power output measurement to adjust a phase and a gain of an input signal to the filter circuitry to reduce power of an image frequency.

* * * * *